United States Patent [19]

Nowak et al.

[11] Patent Number: 5,298,863
[45] Date of Patent: Mar. 29, 1994

[54] MAGNETIC RESONANCE IMAGING APPARATUS HAVING A RESONANT CIRCUIT FOR GENERATING GRADIENT FIELDS, AND METHOD FOR OPERATING SAME

[75] Inventors: Stefan Nowak; Franz Schmitt, both of Erlangen; Hubertus Fischer, Bamberg, all of Fed. Rep. of Germany

[73] Assignee: Siemens Aktiengesellschaft, Munich, Fed. Rep. of Germany

[21] Appl. No.: 621,040

[22] Filed: Dec. 3, 1990

[30] Foreign Application Priority Data

Dec. 1, 1989 [EP] European Pat. Off. ........ 89122188.9

[51] Int. Cl.5 .............................................. G01R 33/20
[52] U.S. Cl. ................................... 324/318; 324/322; 324/300
[58] Field of Search ............... 324/307, 309, 318, 322; 331/165, 166, 173; 328/113, 223; 310/321, 320

[56] References Cited

U.S. PATENT DOCUMENTS

| | | | |
|---|---|---|---|
| 3,579,111 | 5/1971 | Johannessen et al. | 325/141 |
| 3,708,760 | 1/1973 | Farkas | 331/165 |
| 3,763,478 | 10/1973 | Yoshizawa | 328/113 |
| 4,628,264 | 12/1986 | Rzedzian | 324/322 |
| 4,668,904 | 5/1987 | Kupiainen | 323/350 |
| 4,678,996 | 7/1987 | Haake et al. | 324/309 |
| 4,752,735 | 6/1988 | Onodera et al. | 324/312 |
| 4,808,928 | 2/1989 | Frahm et al. | 324/304 |
| 4,890,063 | 12/1989 | Haragashira | 324/322 |
| 4,901,020 | 2/1990 | Ladebeck et al. | 324/309 |
| 4,916,395 | 4/1990 | Usui | 324/307 |
| 4,993,075 | 2/1991 | Sekihara et al. | 324/307 |
| 5,017,817 | 5/1991 | Mueller et al. | 324/318 |
| 5,079,503 | 1/1992 | Siebold et al. | 324/309 |

FOREIGN PATENT DOCUMENTS

| | | |
|---|---|---|
| 0227411 | 7/1987 | European Pat. Off. . |
| 2831610 | 12/1977 | Fed. Rep. of Germany ...... 328/113 |
| 3643577 | 6/1988 | Fed. Rep. of Germany . |

OTHER PUBLICATIONS

Kim et al, "Whole Body NMR Spiral Echo Planar Imaging Using Resonant Gradient Coil", Book of Abstracts, Soc. of Magn. Res. in Medicine, 7th Annual meeting and Exhibition p. 1013 (1988) (no month).
"Instrumentation fir NMR Spin-Warp Imaging" Johnson et al., J. Phys. E: Sci. Instrum., vol. 15, pp. 74–79 (1982) (no month).
"A Whole Body NMR Imaging Machine" Hutchison et al. J. Phys. E: Sci. Instrum., vol. 13, pp. 947–955 (1980).
"MR Angiography with Gradient Motion Refocusing" Laub et al. J. Comput. Assist Tomogr. vol. 12, No. 3 pp. 377–382 (1988) (no month).

Primary Examiner—Kenneth A. Wieder
Assistant Examiner—Raymond Y. Mah
Attorney, Agent, or Firm—Hill, Steadman & Simpson

[57] ABSTRACT

A gradient coil for generating a periodically changing read-out gradient in a magnetic resonance imaging apparatus is operated in a series resonant circuit having a capacitor. One of the elements of the series resonant circuit is charged before the beginning of each read-out gradient. The gradient coil can be charged with current, or the capacitor can be charged with voltage. Such operation either avoids or significantly shortens the transient effect which occurs after excitation of the nuclear spins. The use of a series resonant circuit instead of a parallel resonant circuit significantly reduces the voltage load on the gradient amplifier, so that the gradient amplifier can be constructed simpler and more inexpensively.

18 Claims, 6 Drawing Sheets

FIG 29

MAGNETIC RESONANCE IMAGING APPARATUS HAVING A RESONANT CIRCUIT FOR GENERATING GRADIENT FIELDS, AND METHOD FOR OPERATING SAME

BACKGROUND OF THE INVENTION

1. Field of the Invention

The present invention is directed to magnetic resonance imaging (MRI or nuclear magnetic resonance (NMR)) imaging devices operated with a pulse sequence wherein a read-out sequence including at least two relatively-perpendicular gradients are generated per scan for location coding following a spin excitation, wherein the resulting signals are digitized and written in the K-space in a raw data matrix, wherein an image is acquired from the raw data matrix by conducting at least two-dimensional Fourier transformation, and wherein at least one gradient coil is connected with a capacitor to form a series resonant circuit connected to a gradient amplifier, the gradient amplifier being driven according to a predetermined time function.

2. Description of the Prior Art

A method for operating a nuclear magnetic resonance tomography apparatus known as the echo planar imaging (EPI) method is disclosed in European application 0 076 054, corresponding to U.S. Pat. No. 4,509,015. In summary, the echo planar imaging method includes the generation of an RF excitation pulse which is made slice-selective by simultaneously generating a magnetic field gradient in a first direction. A phase coding gradient is generated in a second direction, and a read-out gradient consisting of a gradient pulse sequence changing in polarity from pulse-to-pulse is generated in a third direction. The nuclear magnetic resonance signal acquired under the read-out gradient is phase demodulated, and is conducted through a bandpass filter. The output of the filter is digitized at a sampling rate and for each gradient pulse, is written into a row of a raw data matrix in the k-space. An image matrix is derived from the raw data matrix by two-dimensional Fourier transformation, and an image is produced from the image matrix.

Further details of the echo planar imaging method are discussed below in connection with FIGS. 1–9 to assist in the explanation of a problem associated with that known method to which the improvement disclosed herein is directed.

Figure 1:
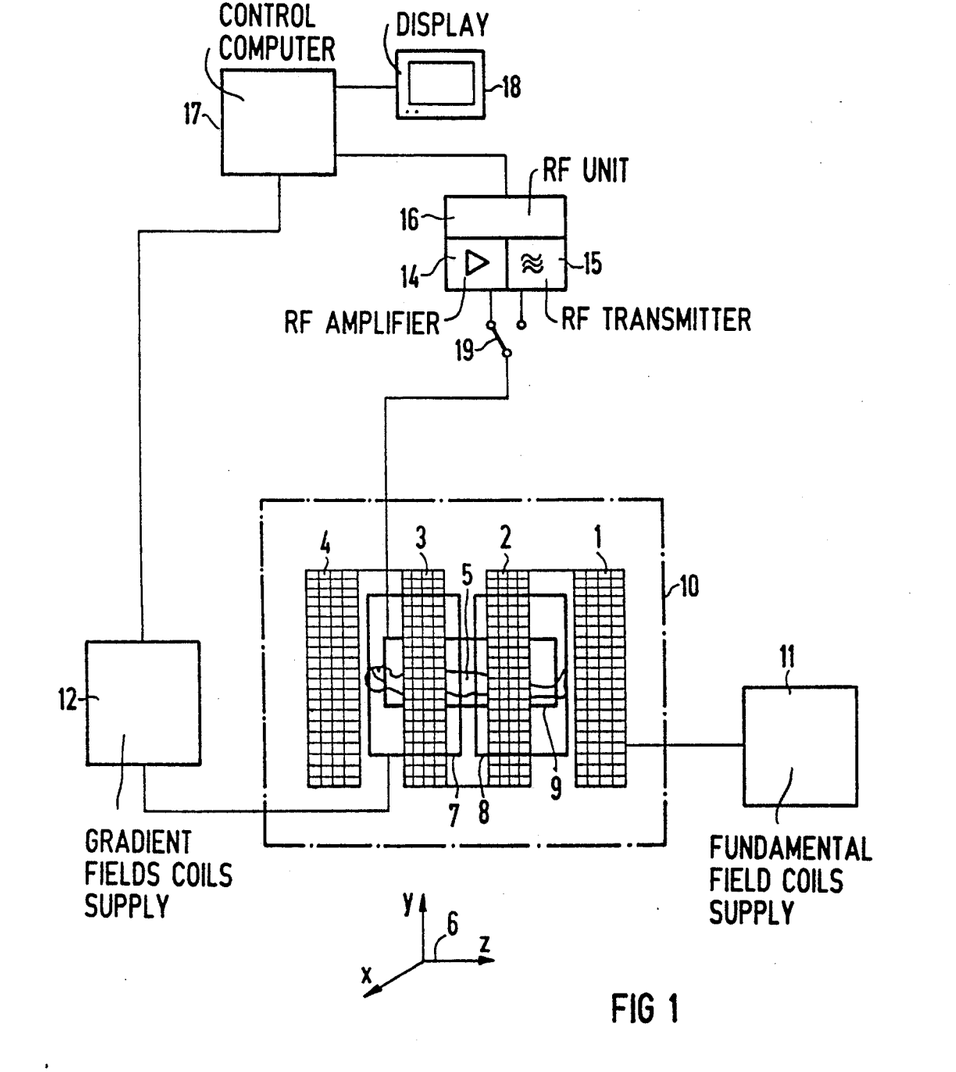
FIG. 1 is a schematic block diagram of a conventional magnetic resonance imaging apparatus.

The basic components of a conventional nuclear magnetic resonance tomography apparatus are shown in FIG. 1. Coils 1–4 generate a static, fundamental magnetic field in which, if the apparatus is used for medical diagnostics, the body of a patient 5 to be examined is situated. Gradient coils are provided for generating independent orthogonal magnetic field components in the x, y and z directions, according to the coordinate system 6. For clarity, only gradient coils 7 and 8 are shown in FIG. 1, which generate the x-gradient in combination with a pair of identical gradient coils disposed on the opposite side of the patient 5. Sets of y-gradient coils (not shown) are disposed parallel to the body 5 above and below the body 5, and sets of z-gradient coils (not shown) are disposed at the head and feet of the body 5 extending transversely relative to the longitudinal axis of the body 5.

The apparatus also includes an RF coil 9 which excites selected nuclei in the body 5 so that nuclear magnetic resonance signals are generated, and also serves to acquire the resulting nuclear magnetic resonance signals.

The coils 1, 2, 3, 4, 7, 8 and 9 bounded by a dot-dash line 9 represent the actual examination instrument. The instrument is operated by an electrical arrangement which includes a fundamental field coils supply 11 for operating the coils 1–4 and a gradient fields coils supply 12 for operating the gradient coils 7 and 8 and the further gradient coils.

Via a switch 19, the RF coil 9 can be connected to an RF transmitter 15, in an excitation mode, or to an amplifier 14 in a signal reception mode. The amplifier 14 and the transmitter 15 are a part of an RF unit 16, which is connected to a process control computer 17. The computer 17 is also connected to the gradient fields coils supply 12. The computer 17 constructs an image from the nuclear magnetic resonance signals, which is portrayed on a display 18.

A number of pulse sequences are known for operating the RF unit 16 and the gradient coils. Methods have prevailed wherein the image generation is based on a two-dimensional or a three-dimensional Fourier transformation. One such method is the aforementioned echo planar imaging method.

Figure 2:
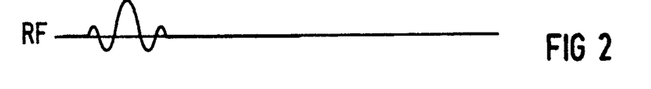
FIGS. 2-7 are curves of various signals arising during the operation of the apparatus shown in FIG. 1.
Figure 3:
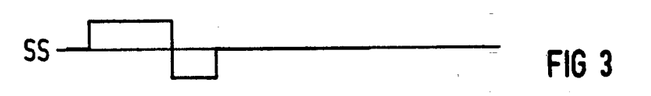

A pulse sequence used in the echo planar imaging method is shown in FIGS. 2–6. A radio-frequency excitation pulse RF, shown in FIG. 2, is generated which excites nuclei in a slice of the examination subject which is selected by a slice-selection gradient SS in the z-direction, shown in FIG. 3, and generated simultaneously with the pulse RF. The direction of the gradient SS is subsequently inverted, the negative gradient portion of SS canceling the dephasing of the nuclear spins which was caused by the positive portion of the gradient SS.

Figure 4:
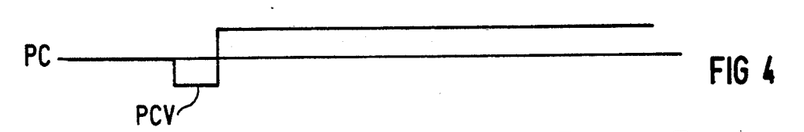
Figures 5, 6, 7:
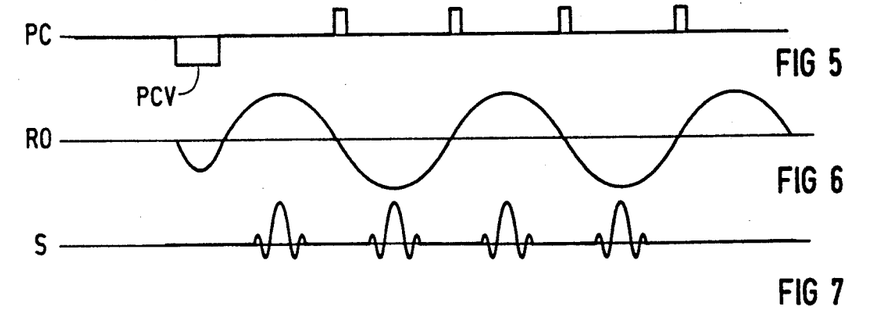

After excitation, a phase coding gradient PC and a read-out gradient RO are generated. There are various possibilities for the respective curves of these two gradients. A phase coding gradient PC is shown in FIG. 4 which remains continuously activated during the read-out phase. An alternative phase coding gradient PC' is shown in FIG. 5 which consists of individual pulses ("blips") which are activated upon the occurrence of each polarity change of the read-out gradient RO. Each version of the phase coding gradient is preceded by a dephasing in gradient PCV in the negative y-direction. The read-out gradient RO is activated with a constantly changing polarity, as a result of which the nuclear spins are alternately dephased and rephased, so that a sequence of signals S arises. After a single excitation, so many signals are required that the entire Fourier k-space is scanned, i.e., the existing information is adequate for the reconstruction of a complete tomogram. For this purpose, an extremely rapid switching of the read-out gradient RO with high amplitude is required, which cannot be achieved with square-wave pulses which are usually employed in NMR imaging. A standard solution to this problem is the operation of the gradient coil which generates the gradient RO in a resonant circuit, so that the gradient RO has a sinusoidal shape.

The nuclear magnetic resonant signals S which arise are sampled in the time domain, are digitized, and the numerical values acquired in this manner are entered into a measurement matrix for each read-out pulse. The measurement matrix can be viewed as a measured data space, and in the exemplary two-dimensional embodiment as a measured data plane, in which the signal values are measured on an equidistant network of points. This measured data space is usually referred to in nuclear magnetic resonant tomography as the k-space.

Data identifying the spatial derivation of the signal contributions, which is needed for image generation, is coded in the phase factors, with the relationship between the locus space (i.e., the image) and the k-space being mathematically representable by a two-dimensional Fourier transformation. Each point in the k-space (in this case the k-plane) is therefore representable by the relationship:

$$f(k_x, k_y) = \int\int \zeta(x,y) e^{i(k_x x + k_y y)} \, dxdy, \text{ wherein}$$

$$k_x(t) = \gamma \int_0^t G_x(t') dt', k_y(t) = \gamma \int_0^t G_y(t') dt',$$

wherein $\gamma$ is the gyromagnetic ratio, and $\zeta(x,y)$ is the spin density distribution taking the relaxation times into consideration.

Figure 8:
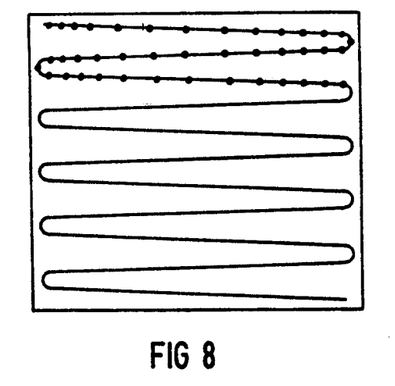
FIG. 8 is a schematic representation of the entry of data into a raw data matrix in the operation of an apparatus as shown in FIG. 1, using a phase coding gradient as shown in FIG. 4.
Figure 9:
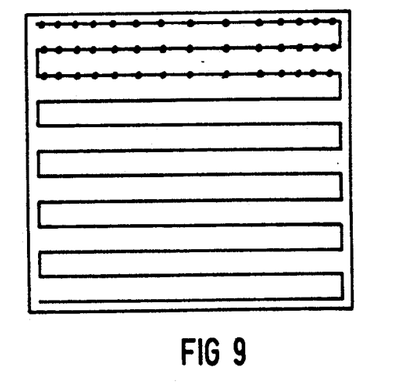
FIG. 9 is a schematic representation of the entry of data into a raw data matrix in the operation of the apparatus shown in FIG. 1, using a phase coding gradient as shown in FIG. 5.

In FIGS. 8 and 9, the positions of the acquired measured values are schematically illustrated by points on a k-space trajectory in the k-space (k-plane). FIG. 8 shows the case for the continuous gradient PC of FIG. 4, and FIG. 9 shows the case for the gradient PC' shown in FIG. 5 in the form of a series of blips. For the Fourier transformation, the values must lie in an equidistant network of points, which is not the case in the examples shown in FIGS. 8 and 9. The acquired measured values therefore cannot be directly utilized, and an interpolation of the measured values onto an equidistant network of points must be undertaken.

Extremely high gradient amplitudes are needed for location coding of the NMR signals in the EPI method. These high gradient amplitudes must be activated and deactivated in short time intervals (<1 ms), so that the necessary information can be acquired before the NMR signal decays. Due to the inductance and resistance of the gradient coils, these requirements cannot be satisfied in practice with a gradient coil connected directly to a gradient amplifier, because a terminal power of approximately 5 MW would be required.

The above problem can be resolved by connecting the gradient coil with a capacitor to form a parallel resonant circuit, as described in European application 0 227 411 and U.S. Pat. No. 4,628,264. To make parasitic transient effects as short as possible, the resonant capacitor is charged to the required voltage before the actual measuring sequence begins. After the field-generating gradient coil is connected into the circuit, the parallel resonant circuit immediately oscillates at the resonant frequency determined by the capacitor. There is thus substantially no transient effect. The capacitor, however, must be charged to an extremely high voltage (several kV), which requires that the gradient amplifier be capable of handling such voltages.

A series resonant circuit for generating gradient currents for the EPI method is generally described in the article "Whole Body NMR Spiral-Scan Echo Planar Imaging (SEPI) Using Resonant Gradient Coil," Kim et al., Society of Magnetic Resonance in Medicine, 7th Annual Meeting, Book of Abstracts, pg. 1013, however, the manner by which the series resonant circuit disclosed therein is caused to resonate is not discussed.

European application 0 389 666 discloses a gradient coil operated in a series resonant circuit in which the transients is controlled so that the current integral from the time of activation ($t=t_0$) to a defined time ($t=t_1$) just becomes zero. The capacitor of the series resonant circuit is thus charged to the necessary voltage without the gradient amplifier having to supply this voltage.

A disadvantage in these known circuits is the relatively long rise time caused by the inductance and resistance of the circuit, as well as by the output voltage of the gradient amplifier. Because the transient effect occurs with a relatively high operating frequency, the frequency-dependent resistance of the gradient coil also has a high value, which significantly lengthens the rise time.

SUMMARY OF THE INVENTION

It is an object of the present invention to provide a magnetic resonance imaging apparatus of the type described above, and a method for operating such an apparatus, wherein the rise time can be substantially avoided without great expense.

In a first embodiment of the invention, the above object is achieved wherein the gradient coil, which is connected in a series circuit with a capacitor, is charged with current before the beginning of the read-out sequence, given an interruption of the series resonant circuit.

In a second embodiment of the invention, the above object is achieved by interrupting the series resonant circuit before beginning a read-out sequence, and charging the capacitor with voltage.

In both of the above embodiments, the transient effect is noticeably accelerated, i.e., the read-out of the echo signals can be begun quickly after the excitation, before a noticeable signal loss due to the relaxation of the nuclear spins has occurred. Such an arrangement can be used whenever gradients must be switched rapidly and/or with high amplitude.

In a third embodiment of the invention, the above object is achieved by connecting the gradient coil to the gradient amplifier via a first switch and via a series circuit consisting of a second switch and the capacitor. This embodiment is operated according to the following steps. The series resonant circuit begins to resonate with the second switch closed. The second switch is then opened, and an excitation of the nuclear spins occurs as soon as the current through the gradient coil crosses the zero axis, and the capacitor is charged to the desired value. A pre-phasing of the excited nuclear spins is accomplished by closing the first switch. The second switch is again closed during the read-out sequence, so that the series resonant circuit resonates.

The pre-charging of the capacitor thus takes place via the series resonant circuit. Because this pre-charging occurs before the excitation, the time required to accomplish this does not have a disturbing effect with regard to a signal drop-off.

Operation at different resonant frequencies is possible by providing a plurality of capacitors which can be switched in series with the gradient coil via respective switches, so that the series resonant circuit can be set to different resonant frequencies, depending upon the states of the respective switches.

The magnetic resonance imaging apparatus can be switched for operation in a mode without the resonant circuit in a simple manner by connecting a switch in parallel with the capacitor of the series resonant circuit. When this switch is closed, the gradient coil is directly connected to the gradient amplifier, i.e., is no longer operated in a resonant circuit. This is preferable in pulse sequences wherein the gradient switching is not rapid.

DESCRIPTION OF THE PREFERRED EMBODIMENTS

Figures 10, 11:
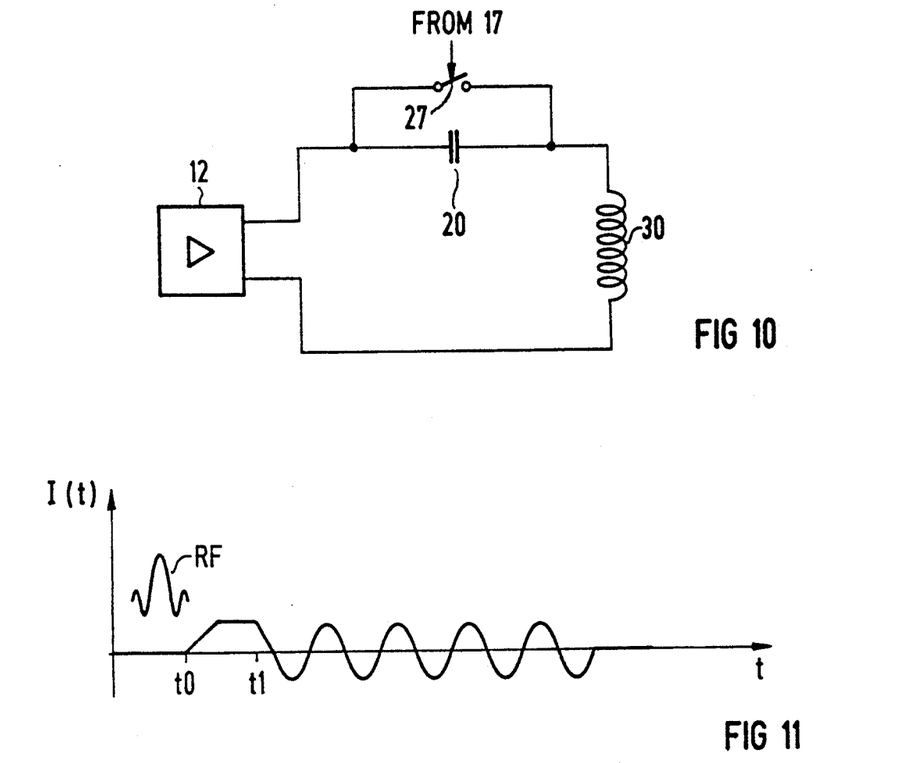
FIG. 10 is a circuit diagram of a resonant circuit for use in a magnetic resonance imaging apparatus constructed in accordance with the principles of the present invention, in a first embodiment wherein the gradient coil is charged with current.
FIGS. 11-13 are curves showing the current through the gradient coil of FIG. 10 under various conditions.

A first embodiment of a circuit constructed in accordance with the principles of the present invention is shown in FIG. 10. A series resonant circuit is shown therein formed by a capacitor 20 and a gradient coil 30. The series resonant circuit is connected to a gradient amplifier 12, and the capacitor 20 is bridged by a switch 27 operated under the control of the computer 17. It is assumed in the following example that the gradient coil 30 is used for generating a read-out gradient RO within the framework of an EPI sequence. The switch 27 is thereby closed after the RF excitation pulse. The gradient coil 30 is thus charged with the desired intensity of current. The switch 27 is then opened, so that the series resonant circuit immediately oscillated in resonance, and the read-out gradient thus takes effect.

The curve of the current I(t) through the gradient coil 30 which occurs in the circuit of FIG. 10 is shown in FIG. 11. The RF excitation pulse is also shown in FIG. 11. After the RF pulse, the switch 27 is closed again at time $t_0$, and is opened again at time $t_1$, with the read-out period immediately following.

Compared to conventional methods for operating the series resonant circuit, the disturbing time between the excitation pulse and read-out sequence is considerably shortened with the above circuit. This is because the resistance of the gradient coil is highly frequency-dependent, particularly due to the skin effect, and is noticeably lower given the low "turn-on frequency" which is present in the above embodiment, and given the relatively high resonant frequency of the series resonant circuit. The ohmic resistance of a gradient coil may be, for example, 0.22 ohms at a frequency of 0.25 kHz, but may be 1.32 ohms at 1.25 kHz. The inductance changes only slightly with frequency. Typical switching times for the illustrated embodiment are approximately 1 millisecond for the maximum current $I_0$.

The current integral of the gradient current generated by the turn-on event from time $t=t_0$ to the end of the turn-on event $t=t_1$ is no longer zero, i.e.:

$$\int_{t_0}^{t_1} I(t')dt' > 0$$

This current integral, which influences the phase relation of the excited nuclear spins, is generally referred to as "pre-phasing." In the EPI method, a defined pre-phasing is generally set. A pre-phasing is usually used because the best imaging results are obtained when the measured values having the highest amplitude come to lie in the middle of K-space, i.e., of the matrix of raw data according to FIG. 8 or FIG. 9. This is achieved by a defined pre-phasing in the phase-coding and read-out direction.

Figure 12:
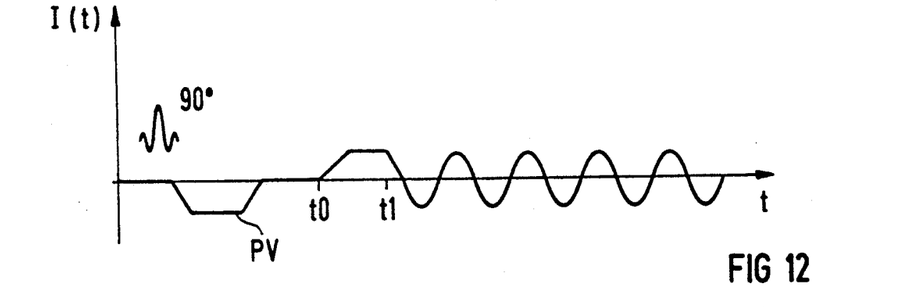

The pre-phasing must be precisely set to achieve optimum image results. In the exemplary embodiment of pulse sequence as shown in FIG. 12, therefore, a current pulse PV for pre-phasing is generated before the time $t_0$ of the charging event of the gradient coil 30. The required value for the pre-phasing can be precisely set on the basis of the length or amplitude of the current pulse PV.

Figure 13:
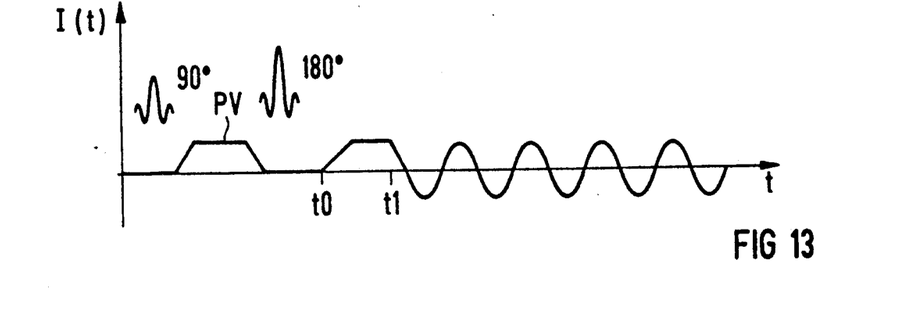

Given a pulse sequence wherein the nuclear spins are inverted by a 180° RF-pulse, the effect of a preceding pulse rotation is also inverted. In this case, shown in FIG. 13, a positive current pulse PV must be activated instead of a negative current pulse PV as shown in FIG. 12, if the current pulse PV precedes the 180° RF-pulse.

Figure 14:
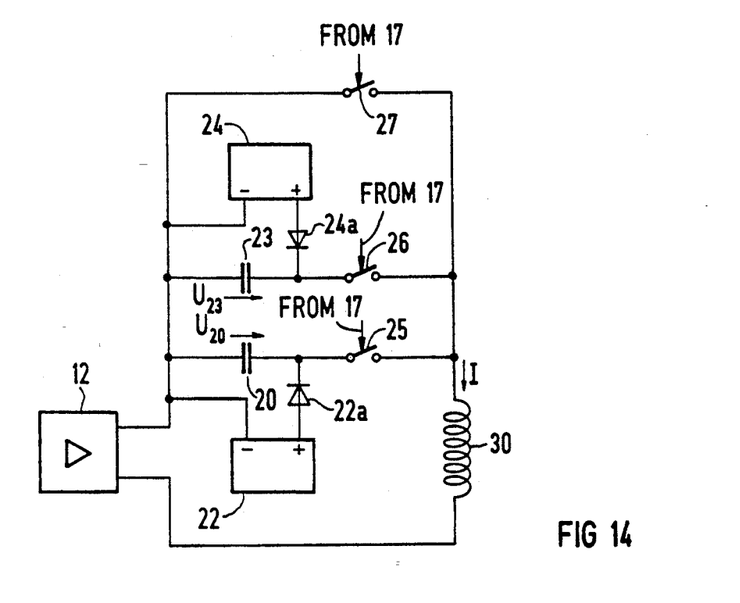
FIG. 14 is a circuit diagram of a resonance circuit for use in a magnetic resonance imaging apparatus constructed in accordance with the principles of the present invention in a second embodiment, wherein the capacitors are charged with voltage.

In the further circuit embodiment shown in FIG. 14, the necessary energy is stored in a capacitor before the read-out sequence. The gradient coil 30 is thereby connected to the gradient amplifier 12 via the capacitor 20 and via a first switch 25 as well as by a further capacitor 23 and a second switch 26 connected in parallel with the capacitor 20 and the first switch 25. The switches 25, 26 and 27 are operated under the control of the computer 17. The coil 30 is also connected to the gradient amplifier 12 via another switch 27. Auxiliary voltage sources 22 and 24 are respectively provided for the capacitors 20 and 23. The voltage sources 22 and 24 are connected to the respective capacitors via respective diodes 22a and 24a. Different resonant frequencies $f_0$ and $f_1$, defined by the capacitance of the capacitors 20 and 27, can be set dependent upon the state of the switches 25 and 26.

Figure 15:
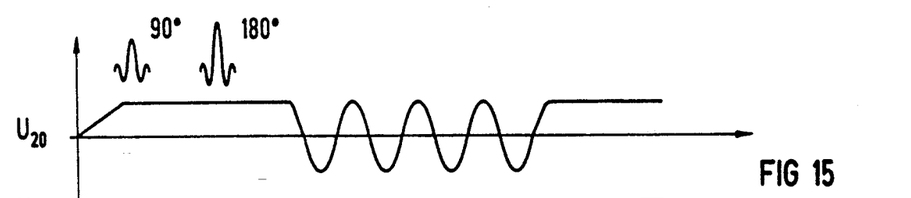
FIGS. 15-18 are curves of signals arising in the operation of the circuit of FIG. 14.
Figure 16:
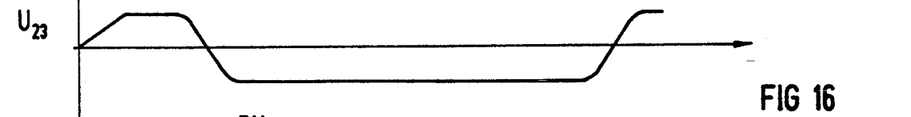
Figures 17, 18:
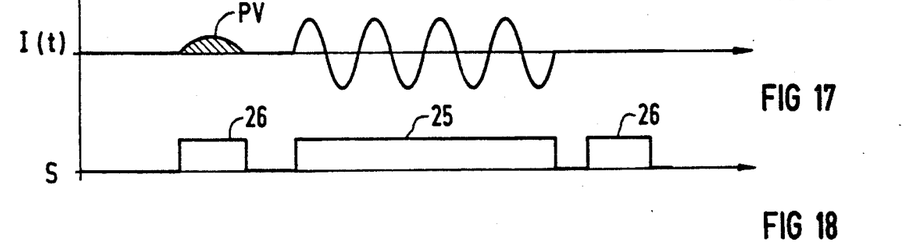

The capacitors 20 and 23 are first charged before the beginning of a pulse sequence. The respective voltage curves $U_{20}$ and $U_{22}$ across the capacitors 20 and 23 are shown in FIGS. 15 and 16. The curve of the current I(t) through the gradient coil 30 is shown in FIG. 17, and the corresponding states of the switches 25 and 26 are shown in FIG. 18.

As can be seen from FIGS. 15 and 16, the capacitors 20 and 23 are first charged by the auxiliary voltage sources 22 and 24 in a first phase. The switch 26 is subsequently closed in a second phase, so that the capacitor 23 discharges via the gradient coil 30, and thereby reverses its voltage. A current pulse PV which effects a pre-phasing of the nuclear spins thereby arises. The switch 26 is then opened.

In a third phase, the switch 25 is closed. The resonant circuit consisting of the capacitor 20 and the gradient coil 30 thus begins to resonate, whereby the sinusoidal curve for the current I(t) is used for generating the read-out gradient. After complete registration of the measured data, the switch 25 is opened at the zero-axis crossing of the current, whereby the capacitor 20 is again charged. The next measuring sequence can thus begin.

In this embodiment, the auxiliary voltage sources 22 and 24 must supply the full capacitor voltage. In comparison to the gradient amplifier 12, however, the voltage sources 22 and 24 need only deliver a low current, so that the complexity and cost of the auxiliary voltage sources remains low.

In the circuit shown in FIG. 14, the gradient amplifier 12 may also be used for the direct drive of the gradient coil 30, without the resonant circuit, by closing the switch 27. Operation of the circuit of FIG. 14 in this manner is suitable for applications wherein the tomography apparatus is switched in pulse sequences wherein direct drive of the gradient coils by the gradient amplifier is beneficial.

Figure 19:
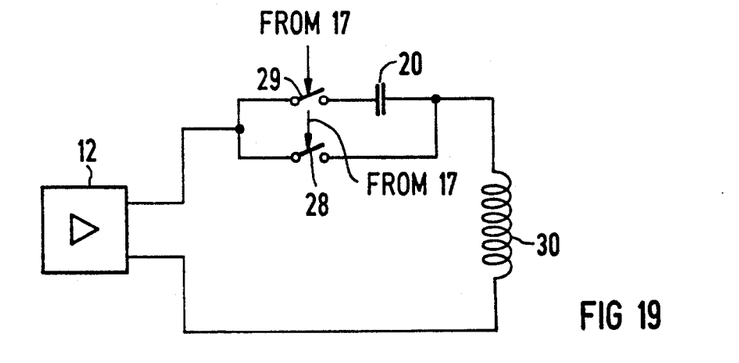
FIG. 19 is a circuit diagram of a further embodiment of a resonant circuit for use in a magnetic resonance imaging apparatus constructed in accordance with the principles of the present invention.
Figure 21:
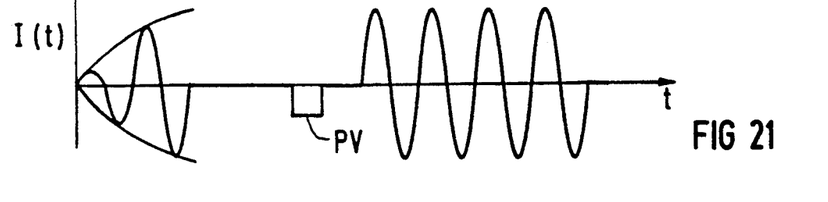
Figure 22:
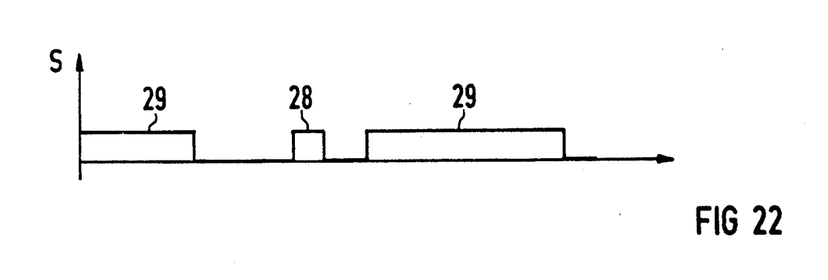

A further embodiment of a resonant circuit in accordance with the principles of the present invention is shown in FIG. 19, wherein the capacitor 20 of the series resonant circuit is charged. The gradient coil 30 is optionally connectable to the gradient amplifier 12 directly via a switch 28, or via a switch 29 in series with the capacitor 20. The switches 28 and 29 are operated under the control of the computer 17. The operation of the circuit of FIG. 9 will be described with reference to FIGS. 20–22. As shown in FIG. 22, the switch 29 is activated before the beginning of a measuring sequence, and the gradient amplifier 12 is driven so that the series resonant circuit consisting of the capacitor 20 and the gradient coil 30 begins to resonate with increasing amplitude. As soon as the capacitor 20 has the necessary charge, the switch 29 is opened at the zero-axis crossing of the current.

Figure 20:
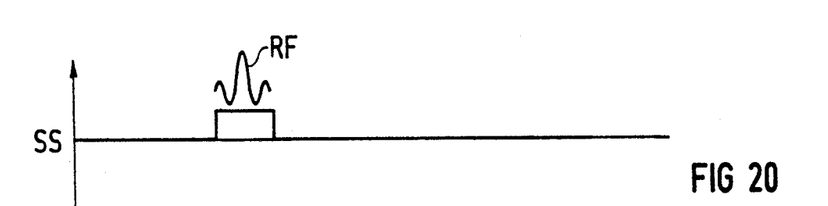
FIGS. 20-22 are curves arising during the operation of the circuit shown in FIG. 19.

As shown in FIG. 20, the excitation of the nuclear spins by a slice selective RF pulse subsequently occurs. By closing the switch 28, a short current pulse PV is supplied to the gradient coil 30, so that a pre-phasing takes place. The switch 29 is then closed. Because the capacitor 20 is charged, the series resonant circuit begins to resonate without transient effect.

Figure 23:
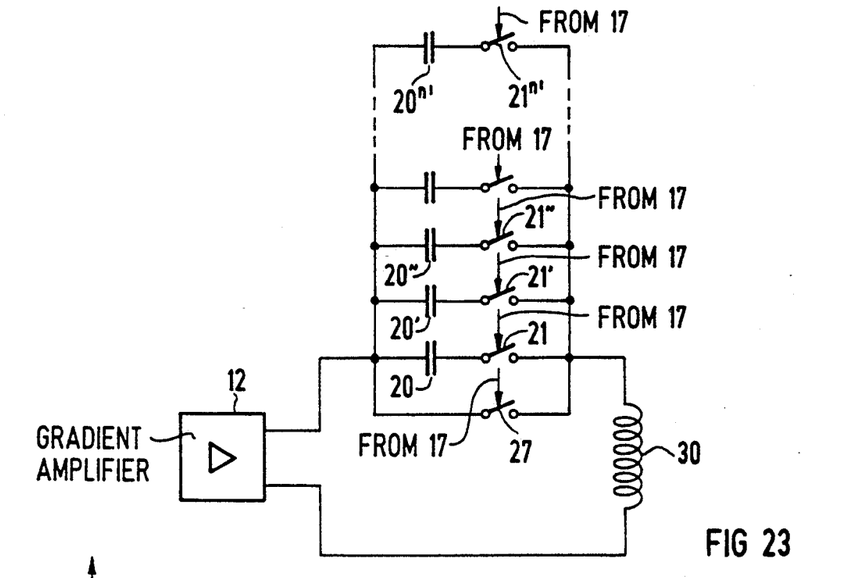
FIG. 23 is a circuit diagram of a further embodiment of a resonant circuit for use in a magnetic resonance imaging apparatus constructed in accordance with the principles of the present invention, wherein the resonant frequency can be switched.
Figure 24:
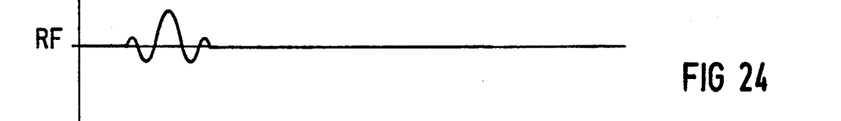
FIGS. 24-28 show a conventional gradient echo sequence which can be generated using any of the embodiments of the series resonant circuit constructed in accordance with the principles of the present invention.

The series resonant circuit in all of the above embodiments can be designed for a plurality of resonant frequencies by the use, as shown in FIG. 23 of a plurality of capacitors 20 through $20^{n'}$ respectively connected in series with switches 21 through $21^{n'}$. The series branches each consisting of a capacitor and switch are connected in parallel so that any combination of capacitors 20 through $20^{n'}$ can be connected in series with the gradient coil 30 to form a series resonant circuit. The switches 21 through $21^{n'}$ are operated under the control of the computer 17.

It must be emphasized that the circuits described above can be used to advantage not only for pulse sequences according to the EPI method, as shown in FIGS. 2–9, but can also be used with beneficial results under any circumstances wherein gradients must be rapidly switched and/or with high amplitude.

Figure 25:
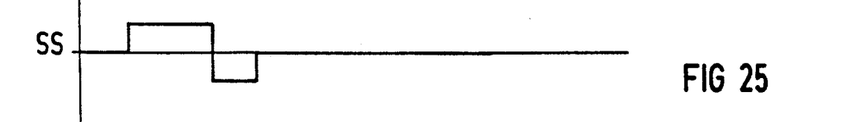
Figure 26:
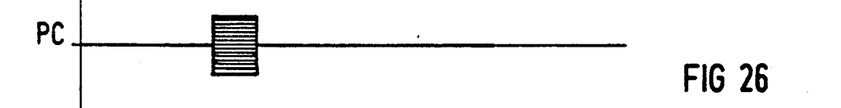
Figure 27:
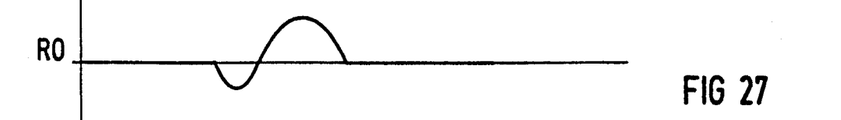
Figure 28:
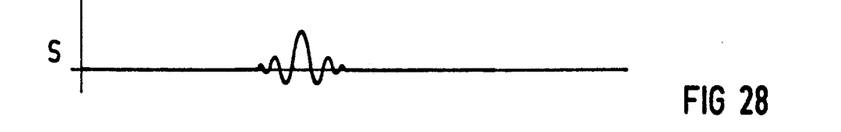

A conventional gradient echo sequence is set forth in FIGS. 24–28 as a further exemplary embodiment of a pulse sequence with which the series resonant circuits disclosed herein can be used. In this known sequence, a radio-frequency excitation pulse RF (FIG. 24) is first generated under the influence of a slice selection gradient SS (FIG. 25). Subsequently, the phase rotation caused by the slice selection gradient SS is rephased, and a phase coding gradient PC (FIG. 26) which is variable step-by-step from scan-to-scan is generated. The spins are dephased by a negative pulse in the read-out direction. A signal S (FIG. 28) arises as an echo signal as a result of the following read-out gradient RO (FIG. 27). As shown in FIG. 27, the read-out gradient RO may have a sinusoidal shape, and thus can be generated with a series resonant circuit constructed in accordance with the principles of the present invention.

Figure 29:
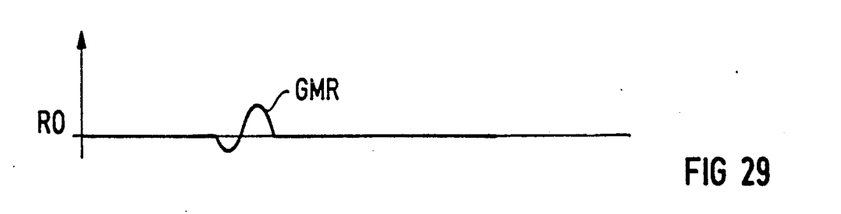
FIG. 29 shows the curve of a refocussing gradient which can be generated by any of the embodiments of the series resonant circuit constructed in accordance with the principles of the present invention.

As shown in FIG. 29, a flux rephasing can be achieved by generating what is known as a gradient motion refocussing (GMR) gradient. The dephasing of the spins in a moving medium can be canceled by such a gradient in the read-out direction as described, for example, in the article "MR Angiography with Gradient Motion Refocussing," Laub et al. Journal of Computer-Assisted Tomography, Vol. 12, No. 3 (1988), pp. 377–382. If this GMR pulse has a sinusoidal shape, it can also be generated using a series resonant circuit as disclosed herein.

The unequal chronological durations of the positive and negative sub-pulses of the waveforms of FIGS. 27 and 29 can be achieved by frequency switching of the series resonant circuit, for example, by switching the capacitors as in the exemplary embodiment of FIG. 23.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a magnetic resonance imaging apparatus operated by a pulse sequence which drives a gradient amplifier, said pulse sequence including a read-out sequence wherein relatively-perpendicular read-out and phase coding gradients are generated by respective gradient coils connected to said gradient amplifier for location coding per scan following an RF excitation of an examination subject, wherein signals read-out during said read-out sequence are digitized and written in K-space in a raw data matrix, and wherein an image of said examination subject is obtained by at least two-dimensional Fourier transformation of the data in said raw data matrix, the improvement comprising:

at least one of said gradient coils being connected in series with a capacitor to form a series resonant circuit which is connected to said gradient amplifier, said gradient coil and said capacitor constituting series resonant circuit components;
interrupting and charging means for interrupting said series resonant circuit before the beginning of said read-out sequence and for charging one of said series resonant circuit components; and
means for generating a pre-phasing gradient pulse in the direction of said read-out gradient before signals are read-out, said pre-phasing pulse having dimensions so that a maximum of said signals read out during said read-out sequence come to lie in the middle of the K-space in said raw data matrix.

2. The improvement of claim 1 wherein said interrupting and charging means is a means for interrupting said series resonant circuit before the beginning of said read-out sequence and for charging said gradient coil with current, and includes a normally-open switch bridging said capacitor, and means for closing said switch between said RF excitation and said read-out sequence until said gradient coil is charged with a specified current.

3. The improvement of claim 1 wherein said interrupting and charging means is a means for interrupting said series resonant circuit before the beginning of said read-out sequence and for charging said capacitor with voltage, said interrupting and charging means including an auxiliary voltage source connected across said capacitor.

4. The improvement of claim 1 further comprising:
said series resonant circuit having a further capacitor connected in parallel with said capacitor; and
said interrupting and charging means further including a first switch connected in series with said at least one gradient coil and said capacitor in said series resonant circuit, a second switch connected in series with said further capacitor forming a branch in said series resonant circuit connected in parallel across said capacitor and said first switch, first and second auxiliary voltage sources respectively connected in parallel across said capacitor and said further capacitor for respectively charging said capacitor and said further capacitor with voltage, and means for opening said first and second switches to charge said capacitor and said further capacitor with voltage, for briefly closing said second switch for generating a pre-phasing gradient, and for closing said first switch during said read-out sequence.

5. The improvement of claim 1 wherein said interrupting and charging means includes a first switch connected between said at least one gradient coil and said gradient amplifier, and a second switch connected in series with said capacitor, and means for operating said first and second switches for initially closing said second switch so that said series circuit begins to resonate, for opening said second switch as soon as the current through the gradient coil has a zero-axis crossing so that said capacitor is charged to a specified voltage, during which said RF excitation occurs, for closing said first switch to generate a pre-phasing of the excited nuclear spins, and for closing said second switch during said read-out sequence so that said series resonant circuit again resonates.

6. The improvement of claim 1 wherein said series resonant circuit further comprises a plurality of further capacitors connected in parallel across said capacitor, and wherein said interrupting and charging means includes a plurality of switches respectively connected in series with each of said capacitor and said further capacitors, and means for selectively operating said switches in said plurality of switches so that said series resonant circuit can be set to different resonant frequencies depending upon the respective states of said switches.

7. A magnetic resonance imaging apparatus as claimed in claim 1 further comprising a switch connected in parallel with said capacitor, and means for closing said switch for operating said gradient coil without said series resonant circuit.

8. A method for operating a magnetic resonance imaging apparatus having a gradient amplifier with a capacitor and at least one gradient coil connected in series therewith to form a series resonant circuit connected to said gradient amplifier, said at least one gradient coil and said capacitor constituting series resonant circuit components, said method comprising the steps of:
generating an RF excitation pulse to excite nuclear spins in an examination subject;
driving said gradient amplifier to generate a read-out sequence including generating relatively-perpendicular read-out and phase coding gradients per scan following said RF excitation pulse, and obtaining nuclear magnetic resonance signals during said read-out sequence;
before signals are read out in said read-out sequence, generating a pre-phasing gradient pulse in the direction of said read-out gradient and dimensioning said pre-phasing pulse so that a maximum of said nuclear magnetic resonance signals comes to lie in the middle of the K-space in a raw data matrix;
interrupting said series resonant circuit before beginning said read-out sequence and charging one of said series resonant circuit components;
digitizing the nuclear magnetic resonance signals to obtain digitized signals;
writing said digitized signals in K-space in said raw data matrix; and
conducting at least a two-dimensional Fourier transformation of the data in said raw data matrix to obtain an image of said examination subject.

9. A method as claimed in claim 8 wherein said series resonant circuit includes a switch bridging said capacitor, and wherein the step of interrupting and charging is further defined by:
interrupting said series resonant circuit before the beginning of said read-out sequence and closing said switch between said RF excitation and said read-out sequence until said gradient coil is charged with a specified current.

10. A method as claimed in claim 8 wherein said series resonant circuit includes a voltage source connected in parallel across said capacitor and a switch connected in series with said at least one gradient coil, and wherein the step of interrupting and charging is further defined by the steps of:
opening said switch to interrupt said series resonant circuit before the beginning of said read-out sequence;
charging said capacitor with voltage using said voltage source; and
closing said switch during said read-out sequence so that said series resonant circuit resonates.

11. A method as claimed in claim 8 wherein said series resonant circuit further includes a first switch connected in series with said capacitor and said coil, a second switch connected in series with a further capacitor and said second switch and said further capacitor connected in parallel across said first switch and said capacitor and first and second voltage sources respectively connected across said capacitor and said further capacitor, and wherein the step of interrupting and charging is defined by the steps of:

opening said first and second switches before said read-out sequence so that said capacitor is charged by said first voltage source and said further capacitor is charged by said second voltage source;

briefly closing said second switch for generating a pre-phasing of said nuclear spins; and closing said first switch during said read-out sequence.

12. A method as claimed in claim 8 wherein said series resonant circuit further includes a first switch connected between said gradient coil and said gradient amplifier, and a second switch connected in series with said capacitor, and wherein the step of interrupting and charging is further defined by the steps of:

closing said second switch before said read-out sequence so that said series resonant circuit begins to resonate:

opening said second switch as soon as the current through the gradient coil has a zero-axis crossing so that the capacitor is charged to a specified value, during which the excitation of nuclear spins occurs;

closing said first switch to generate a pre-phasing of the excited nuclear spins; and closing said second switch during said read-out sequence so that said resonant circuit again resonates.

13. A method as claimed in claim 8 wherein said series resonant circuit further includes a plurality of further capacitors connected in parallel with said capacitor, and a plurality of switches respectively connected in series with said capacitor and said further capacitors, and wherein said method comprises the additional step of:

setting the resonant frequency of said series resonant circuit by closing selective ones of said switches in said plurality of switches.

14. A method as claimed in claim 8 comprising the additional step of:

generating a refocussing pulse consisting of a negative sub-pulse and a positive sub-pulse using said gradient coil in said series resonant circuit.

15. A method as claimed in claim 8 wherein said read-out sequence is an echo planar sequence comprising the steps of:

generating a read-out gradient consisting of a plurality of sub-pulses of alternating polarity simultaneously with generating said phase-coding gradient;

reading out a row of the raw data matrix during each sub-pulse of said read-out gradient; and using said gradient coil in said series resonant circuit to generate said read-out gradient.

16. A method as claimed in claim 8 wherein said read-out sequence is a gradient echo sequence comprising the steps of:

generating a phase-coding gradient, which increases in amplitude step-by-step from scan-to-scan, and pre-phasing gradient pulse and the direction of said read-out gradient for each scan following an excitation pulse;

reading out a row of the raw data matrix per scan under said read-out gradient; and using said gradient coil in said series resonant circuit to generate said read-out gradient.

17. A method for operating a magnetic resonance imaging apparatus having a gradient amplifier with a capacitor and at least one gradient coil connected in series therewith to form a series resonant circuit connected to said gradient amplifier, and said method comprising the steps of:

generating an RF excitation pulse to excite nuclear spins in an examination subject;

driving said gradient amplifier to generate a read-out sequence including generating relatively-perpendicular read-out and phase coding gradients per scan following said RF excitation pulse, and obtaining nuclear magnetic resonance signals during said read-out sequence;

before signals are read out in said read-out sequence, generating a pre-phasing gradient pulse in the direction of said read-out gradient and dimensioning said pre-phasing pulse so that a maximum of said nuclear magnetic resonance signals comes to lie in the middle of the K-space in a raw data matrix;

interrupting said series resonant circuit before the beginning of said read-out sequence and charging said capacitor with voltage;

digitizing the nuclear magnetic resonance signals to obtain digitized signals;

writing said digitized signals in K-space in said raw data matrix; and conducting at least a two-dimensional Fourier transformation of the data in said raw data matrix to obtain an image of said examination subject.

18. A method for operating a magnetic resonance imaging apparatus having a gradient amplifier with a capacitor and at least one gradient coil connected in series therewith to form a series resonant circuit connected to said gradient amplifier, and said method comprising the steps of:

generating an RF excitation pulse to excite nuclear spins in an examination subject;

driving said gradient amplifier to generate a read-out sequence including generating relatively-perpendicular read-out and phase coding gradients per scan following said RF excitation pulse, and obtaining nuclear magnetic resonance signals during said read-out sequence;

before signals are read out in said read-out sequence, generating a pre-phasing gradient pulse in the direction of said read-out gradient and dimensioning said pre-phasing pulse so that a maximum of said nuclear magnetic resonance signals comes to lie in the middle of the K-space in a raw data matrix;

interrupting said series resonant circuit before the beginning of said read-out sequence and charging said gradient coil with current;

digitizing the nuclear magnetic resonance signals to obtain digitized signals;

writing said digitized signals in K-space in said raw data matrix; and conducting at least a two-dimensional Fourier transformation of the data in said raw data matrix to obtain an image of said examination subject.

* * * * *

Adverse Decisions In Interference

Patent No. 5,298,863, Stefan Nowak, Franz Schmitt, Hubertus Fischer, MAGNETIC RESONANCE IMAGING APPARATUS HAVING A RESONANT CIRCUIT FOR GENERATING GRADIENT FIELDS, AND METHOD FOR OPERATING SAME, Interference No. 103,869, final judgment adverse to the patentees rendered May 27, 1998, as to claims 1-18.

*(Official Gazette July 7, 1998)*